United States Patent
Jang et al.

(10) Patent No.: US 10,330,933 B2
(45) Date of Patent: Jun. 25, 2019

(54) HEAD MOUNTED DISPLAY DEVICE

(71) Applicant: Samsung Display Co., Ltd., Yongin-si, Gyeonggi-do (KR)

(72) Inventors: Cheol Jang, Uiwang-si (KR); Sang Hyun Han, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/700,657

(22) Filed: Sep. 11, 2017

(65) Prior Publication Data

US 2018/0097203 A1 Apr. 5, 2018

(30) Foreign Application Priority Data

Sep. 30, 2016 (KR) .................. 10-2016-0126805

(51) Int. Cl.
*G02B 27/01* (2006.01)
*H01L 51/52* (2006.01)
(Continued)

(52) U.S. Cl.
CPC .............. *G02B 27/017* (2013.01); *G02B 1/11* (2013.01); *G02B 5/003* (2013.01); *G02B 27/0172* (2013.01); *H01L 25/105* (2013.01); *H01L 27/3232* (2013.01); *H01L 51/5281* (2013.01); *H01L 51/5284* (2013.01); *G02B 2027/0132* (2013.01); *H01L 27/3244* (2013.01); *H01L 27/3246* (2013.01); *H01L 51/5237* (2013.01); *H01L 51/5275* (2013.01); *H01L 2251/5307* (2013.01); *H01L 2251/558* (2013.01)

(58) Field of Classification Search
CPC .............. H01L 51/5284; H01L 25/105; H01L 27/3244; H01L 51/5281; H01L 27/3232; H01L 27/3246; H01L 2251/5307; G02B 27/017; G02B 27/0172
See application file for complete search history.

(56) References Cited

U.S. PATENT DOCUMENTS 8,106,583 B2 * 1/2012 Shin ..................... H01L 51/5284
313/504
2016/0315125 A1 * 10/2016 Kikuchi ................. G02B 5/201
(Continued)

FOREIGN PATENT DOCUMENTS

JP 2010-145922 A 7/2010
JP 2015-79227 A 4/2015
(Continued)

*Primary Examiner* — Jose R Diaz
(74) *Attorney, Agent, or Firm* — Lewis Roca Rothgerber Christie LLP

(57) ABSTRACT

A head mounted display device according to an exemplary embodiment includes: a case; a display panel that is disposed in the case and is capable of displaying an image; and an optical system between the display panel and a user, wherein the display panel includes a pixel layer that includes a plurality of pixels capable of emitting light and a light blocking layer on the pixel layer and having a plurality of light blocking openings, and the area of a first area where the light blocking layer and the pixel are overlapped with each other in a plane view is gradually increased toward an outer portion of the display panel from a center portion of the display panel.

20 Claims, 16 Drawing Sheets

(51) Int. Cl.
*H01L 27/32* (2006.01)
*H01L 25/10* (2006.01)
*G02B 1/11* (2015.01)
*G02B 5/00* (2006.01)

(56) References Cited

U.S. PATENT DOCUMENTS

2017/0125448 A1* 5/2017 Park .................... H01L 51/5284
2017/0199601 A1* 7/2017 Xu ........................ G06F 3/0412

FOREIGN PATENT DOCUMENTS

| | | |
|---|---|---|
| KR | 10-2005-0054312 A | 6/2005 |
| KR | 10-2010-0059806 A | 6/2010 |
| KR | 10-2016-0036155 A | 4/2016 |

\* cited by examiner

HEAD MOUNTED DISPLAY DEVICE

CROSS-REFERENCE TO RELATED APPLICATION

This application claims priority to and the benefit of Korean Patent Application No. 10-2016-0126805 filed in the Korean Intellectual Property Office on Sep. 30, 2016, the entire contents of which are incorporated herein by reference.

BACKGROUND

1. Field

Embodiments of the present disclosure relate to a head mounted display device.

2. Description of the Related Art

A head mounted display (HMD) is a device that is mounted on the head of a user to display an image to the user, and is highlighted as a visualization device that provides virtual reality (VR) and/or augmented reality (AR). The head mounted display device includes a display panel that displays an image, and an optical system that is disposed between the display panel and a user. In such a head mounted display device, a circularly polarized film is attached to the display panel to minimize or reduce reflection of external light.

However, the circularly polarized light film has low transmittance in a visible ray area and an aperture ratio is deteriorated as a resolution of the head mounted display device is increased, and accordingly transmittance is decreased.

In addition, when a foreign substance is generated in the circularly polarized light film, the foreign substance can be easily seen because a distance between the display panel and eyes of a user is short.

The above information disclosed in this Background section is only for enhancement of understanding of the background of the disclosure and therefore it may contain information that does not form the prior art that is already known in this country to a person of ordinary skill in the art.

SUMMARY

Embodiments of the present disclosure provide a head mounted display device that can minimize or reduce reflection of external light and concurrently (e.g., at the same time) improve transmittance (e.g., visible light transmittance).

A head mounted display device according to an exemplary embodiment includes: a case; a display panel that is disposed in the case and displays an image; and an optical system that is disposed between the display panel and a user, wherein the display panel includes a pixel layer that includes a plurality of pixels and emits light and a light blocking layer that is disposed on the pixel layer and includes a plurality of light blocking openings, and the area of a first area where the light blocking layer and the pixel are overlapped with each other in a plane view is gradually increased toward an outer portion of the display panel from a center portion of the display panel.

The area of a second area where the light blocking opening and the pixel are overlapped with each other in a plane view may be gradually decreased toward an outer portion of the display panel from a center portion of the display panel.

A distance between a center of the pixel and a center of the light blocking opening may be gradually increased toward the outer portion of the display panel from a center portion of the display panel.

A center portion of the display panel may be located corresponding to a center of eyes of a user and a center of the optical system.

The plurality of pixels may include center pixels that are at a center portion of the display panel and outer pixels that are at an outer portion of the display panel, the outer pixels may include upper and lower pixels that are respectively at upper and lower sides of the center pixel, left and right pixels that are respectively at left and right sides of the center pixel, and a diagonal pixel that is located along a diagonal direction from the center pixel, and the first area in the upper pixel may be at an upper portion of the upper pixel in a plane view and the first area in the lower pixel is at a lower portion of the lower pixel in a plane view.

The first area of the left pixel may be at a left portion of the left pixel in a plane view, the first area of the right pixel may be at a right portion of the right pixel in a plane view, and the first area of the diagonal pixel may be located along a diagonal direction from the diagonal pixel in a plane view.

The pixel layer may include: a substrate; a switching layer that is disposed on the substrate and includes a switching element; a first electrode that is disposed on the switching layer and is connected with the switching element; a pixel defined layer including a pixel opening that is disposed on the first electrode and overlaps the first electrode; a second electrode that is disposed opposing the first electrode; and an organic emission layer that is disposed between the first electrode and the second electrode, wherein the pixels may define an area to which light emitted from the first electrode, the second electrode, and the organic emission layer may be emitted through the pixel openings, and a size of each pixel may correspond to a size of each pixel opening.

The pixel layer may further include an anti-reflection layer that reflects external light.

The anti-reflection layer may include an external light reflection layer that is disposed on the second electrode and a phase control layer that is disposed between the second electrode and the external light reflection layer, and the phase control layer may be disposed for destructive interference between first reflection light reflected from the second electrode or the first electrode and second reflection light reflected from the external light reflection layer.

The anti-reflection layer may include a plurality of layers that are stacked and may respectively have different refractive indexes.

The anti-reflection layer may include inorganic layers and organic layers that are alternately stacked.

The display panel may further include a sealing layer that is disposed between the anti-reflection layer and the light blocking layer and seals the pixel layer.

The display panel may further include a transmittance control layer that is disposed on the light blocking layer.

The display panel may further include a circularly polarized layer that is disposed on the light blocking layer.

A thickness of the light blocking layer may be gradually decreased toward the outer portion of the display panel from the center portion of the display panel.

The display panel may include a first display panel that corresponds to a left eye of a user and a second display panel that corresponds to a right eye of the user, the optical system may include a first optical system that corresponds to the first display panel and a second optical system that corresponds to the second display panel, and a length of the first display panel may be greater than a diameter of the first optical system and a length of the second display panel may be greater than a diameter of the second optical system.

A distance between the first optical system and the first display panel may be greater than a distance from the left eye to the first optical system, and a distance between the second optical system and the second display panel may be greater than a distance from the right eye to the second optical system.

A head mounted display device according to another exemplary embodiment includes: a case; a display panel that is disposed in the case and displays an image; and an optical system that is disposed between the display panel and a user, wherein the display panel includes a pixel layer that includes a plurality of pixels and emits light and a light blocking layer that is disposed on the pixel layer and has a plurality of light blocking openings, and the light blocking opening is gradually increased toward an outer portion of the display panel from a center portion of the display panel.

A distance between a center of the pixel and a center of the light blocking opening may be gradually increased toward the outer portion of the display panel from the center portion of the display panel.

The center portion of the display panel may be disposed corresponding to a center of eyes of the user and a center of the optical system.

According to the exemplary embodiment, partial blocking of light emitted from the pixel opening by the light blocking layer can be minimized or reduced, thereby improving transmittance.

In some embodiments, a polarization film is not used for anti-reflection of external light, and accordingly transmittance can be improved.

Further, reflection of external light can be minimized or reduced by using the light blocking layer.

BRIEF DESCRIPTION OF THE DRAWINGS

The accompanying drawings, together with the specification, illustrate embodiments of the subject matter of the present disclosure, and, together with the description, serve to explain principles of embodiments of the subject matter of the present disclosure.

DETAILED DESCRIPTION

Figure 1:
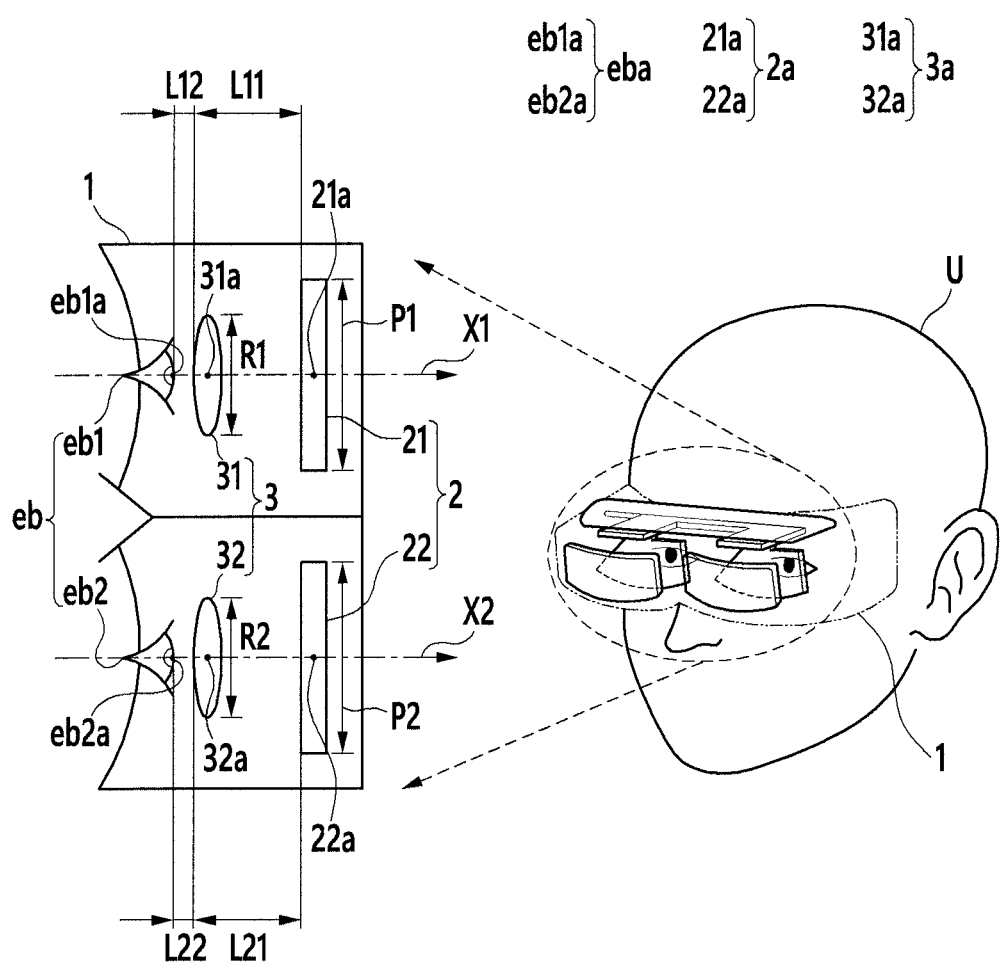
FIG. 1 a schematic view of a head mounted display device according to an exemplary embodiment.

The subject matter of the present disclosure will be described more fully hereinafter with reference to the accompanying drawings, in which exemplary embodiments of the disclosure are shown. As those skilled in the art would realize, the described embodiments may be modified in various different ways, all without departing from the spirit or scope of the present disclosure.

Accordingly, the drawings and description are to be regarded as illustrative in nature and not restrictive. Like reference numerals designate like elements throughout the specification.

In addition, the size and thickness of each configuration shown in the drawings may be arbitrarily shown for better understanding and ease of description, but the present disclosure is not limited thereto.

In the drawings, the thickness of layers, films, panels, regions, etc., may be exaggerated for clarity.

In addition, unless explicitly described to the contrary, the word "comprise" and variations such as "comprises" or "comprising" will be understood to imply the inclusion of stated elements but not the exclusion of any other elements. It will be understood that when an element such as a layer, film, region, or substrate is referred to as being "on" another element, it can be directly on the other element or intervening elements may also be present. In addition, it will also be understood that when an element or layer is referred to as being "between" two elements or layers, it can be the only element or layer between the two elements or layers, or one or more intervening elements or layers may also be present. Throughout the specification, the word "on" means positioning on or below the object portion, but does not essentially mean positioning on the upper side of the object portion based on a gravitational direction.

In this specification, the phrase "in a plane view" means viewing a target portion from the top, and the phrase "on a cross-section" means viewing a cross-section formed by vertically cutting a target portion from the side. As used herein, the term "plane view" may also be referred to as a plan view.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, acts, operations, elements, and/or components, but do not preclude the presence or addition of one or more other features, integers, acts, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

A head mounted display device according to an exemplary embodiment will now be described in more detail with reference to FIG. 1 to FIG. 5.

FIG. 1 schematically illustrates a head mounted display device according to an exemplary embodiment.

As shown in FIG. 1, a head mounted display device according to an exemplary embodiment includes a case 1, a display panel 2, and an optical system 3. The head mounted display device according to the exemplary embodiment is mounted on the head of a user U to display an image to eyes eb, for example, a left eye eb1 and a right eye eb2, of the user U.

The case 1 is mounted on the head of the user U and supports the display panel 2 and the optical system 3. The case 1 may have any suitable shape that can be mounted on the head of the user U while supporting the display panel 2 and the optical system 3. The case 1 may have various shapes, and for example, may be provided as spectacles or a helmet.

The display panel 2 is disposed in the case 1 and displays an image. The display panel 2 includes a first display panel 21 that corresponds to the left eye eb1 of the user U and a second display panel 22 that corresponds to the right eye eb2 of the user U. The first display panel 21 and the second display panel 22 may display the same or substantially the same image. Such a display panel 2 may not only be an organic light emitting diode (OLED) panel, but may also be a liquid crystal display (LCD) panel.

The optical system 3 is disposed opposing the display panel 2, and refracts an image displayed by the display panel 2 in a direction of the eyes eb of the user U. The optical system 3 is disposed between the display panel 2 and the user U. The optical system 3 includes a first optical system 31 that corresponds to the first display panel 21, and a second optical system 32 that corresponds to the second display panel 22.

A length P1 of the first display panel 21 may be greater than a diameter R1 of the first optical system 31, and a length P2 of the second display panel 22 may be greater than a diameter R2 of the second optical system 32. A distance L11 between the first optical system 31 and the first display panel 21 may be greater than a distance L12 between the left eye eb1 of the user U and the first optical system 31, and a distance L21 between the second optical system 32 and the second display panel 22 may be greater than a distance L22 between the right eye eb2 of the user U and the second optical system 32.

Such an optical system 3 is disposed between the eyes eb of the user U and the display panel 2 so that the user U can easily view the display panel 2 that is disposed at a distance close to the eyes eb of the user U.

The optical system 3 may include a convex lens that is convex toward the display panel 2. The optical system 3 may include a concave lens that compensates for distortion caused by the convex lens, and the concave lens may be an aspheric lens.

A center portion 2a of the display panel 2 may correspond to a center eba of the eyes eb of the user U. In some embodiments, a center portion 2a of the display panel 2 may correspond to a center 3a of the optical system 3. For example, a center portion 21a of the first display panel 21, a center 31a of the first optical system 31, and a center eb1a of the left eye may be located on the same or substantially the same first light path X1. Similarly, a center portion 22a of the second display panel 22, a center 32a of the second optical system 32, and a center eb2a of the right eye eb2 may be disposed on the same or substantially the same second light path X2.

Hereinafter, a more detailed structure of the display panel will be described with reference to FIG. 2 to FIG. 4.

Figure 2:
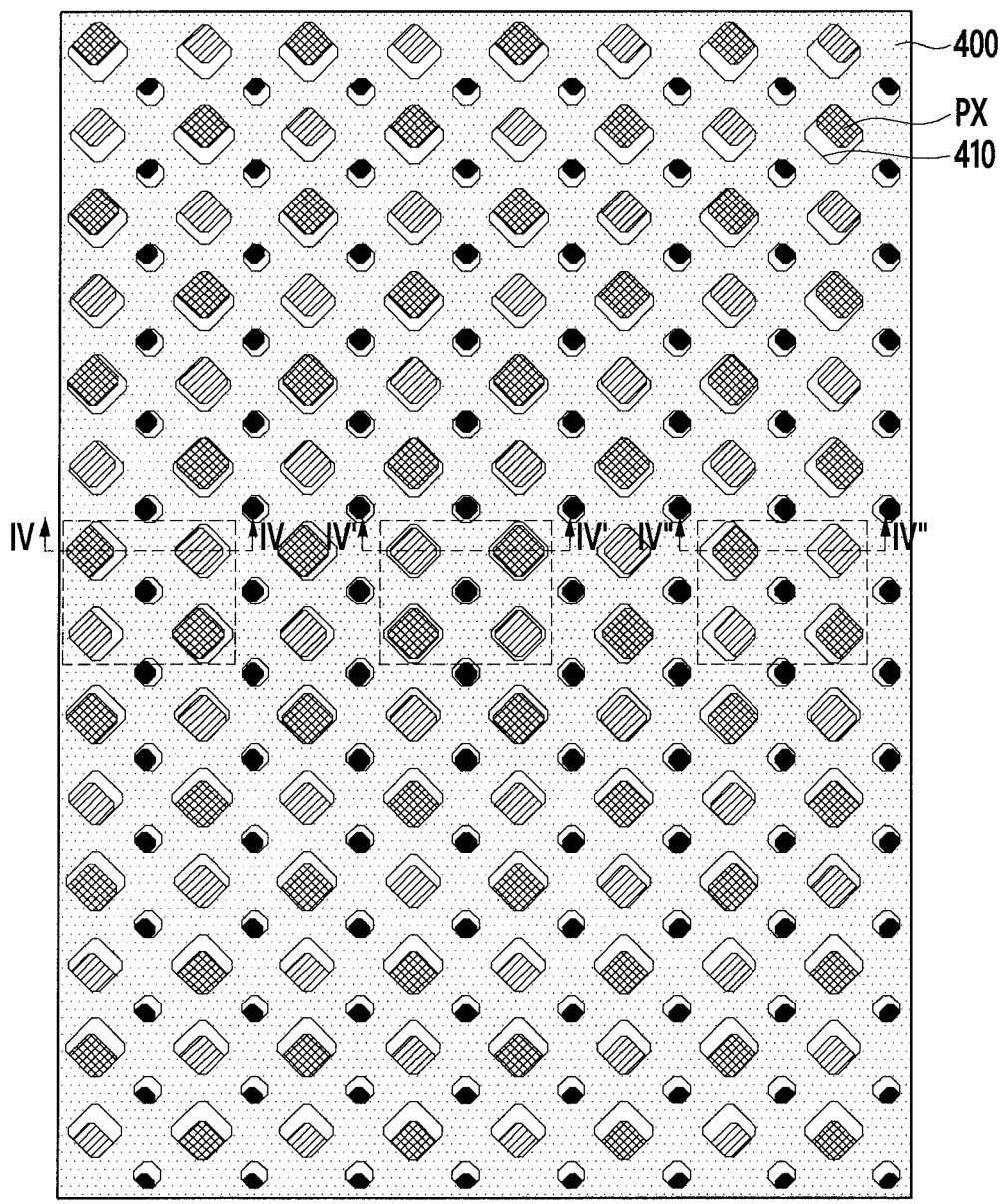
FIG. 2 is a schematic top plan view of a display panel of the head mounted display device of FIG. 1.
Figure 3:
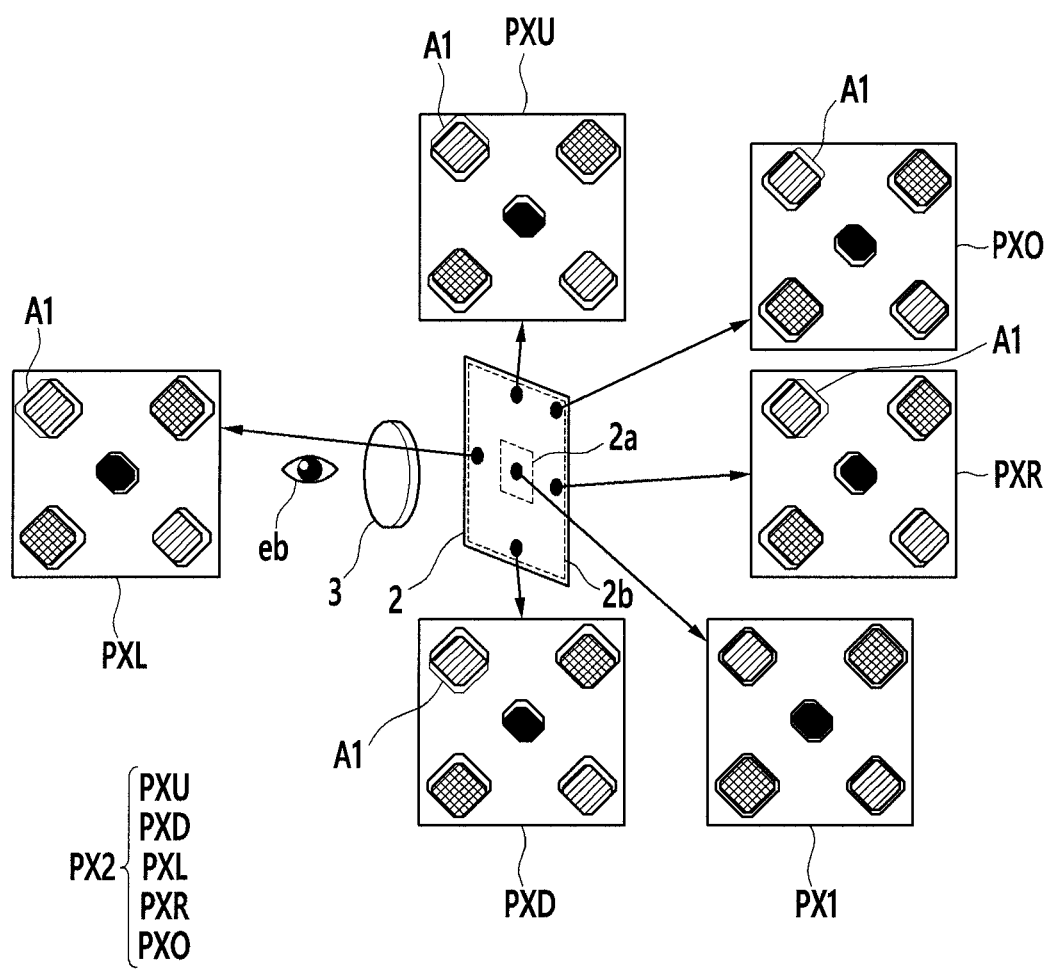
FIG. 3 is a schematic view showing an alignment state of a plurality of pixels depending on locations in the display panel of the head mounted display device FIG. 1.
Figure 4:
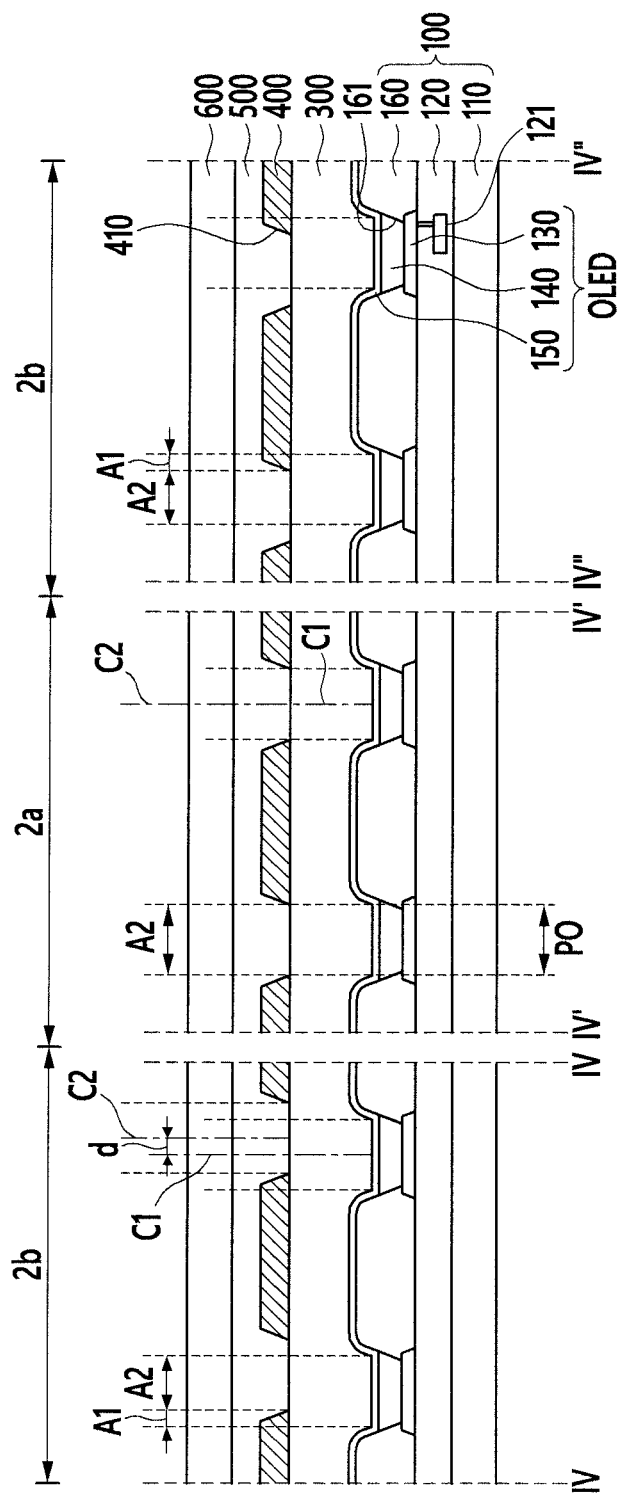
FIG. 4 is a cross-sectional view of FIG. 2, taken along respective lines IV-IV, IV'-IV', and IV"-IV".

FIG. 2 is a schematic top plan view of the head mounted display device of FIG. 1, FIG. 3 is a detailed view of an alignment state of the display panel of the head mounted display device of FIG. 1 depending on locations of a plurality of pixels, and FIG. 4 is a cross-sectional view of FIG. 2, taken along the lines IV-IV, IV'-IV', and IV"-IV".

As shown in FIG. 2 to FIG. 4, the display panel 2 includes a pixel layer 100 that includes a plurality of pixels PX and emits light, a sealing layer 300 that is disposed on the pixel layer 100, and a light blocking layer 400 that is disposed on the sealing layer 300 and has a plurality of light blocking openings 410. Light emitted from the pixel layer 100 is irradiated to the outside through the light blocking openings 410.

As shown in FIG. 4, the pixel layer 100 includes a substrate 110, a switching layer 120 that is disposed on the substrate 110 and includes a switching element 121, a first electrode 130 that is disposed on the switching layer 120 and coupled with (e.g., connected with) the switching element 121, a pixel defined layer 160 that has a pixel opening 161 overlapping the first electrode 130, a second electrode 150 that is disposed opposing the first electrode 130, and an organic emission layer 140 that is disposed between the first electrode 130 and the second electrode 150.

The pixels PX define areas emitted by the first electrode 130, the second electrode 150, and the organic emission layer 140, and are emitted through the pixel openings 161. In this case, a size of each pixel PX corresponds to a size PO of each pixel opening 161.

The substrate 110 may be an insulating substrate that is made of (e.g., includes) glass, ceramic, plastic, and the like, or a metallic substrate that is made of stainless steel and the like.

A switching element 121 of the switching layer 120 may include a gate electrode, a source electrode, and a drain electrode. The switching element 121 may be provided as a transistor that turns each pixel PX on/off. The switching layer 120 may include a plurality of insulation layers for insulation of the gate electrode, the source electrode, and the drain electrode. The insulation layers may include an inorganic layer or an organic layer.

The first electrode 130 may include a transparent conductive material such as indium tin oxide (ITO), indium zinc oxide (IZO), zinc oxide (ZnO), indium oxide ($In_2O_3$), and/or the like, or a reflective material such as lithium (Li), calcium (Ca), lithium fluoride/calcium (LiF/Ca), lithium fluoride/ aluminum (LiF/Al), aluminum (Al), silver (Ag), magnesium (Mg), gold (Au), and/or the like.

The pixel defined layer 160 may include an organic material such as a polyacrylic resin, a polyimide resin, and/or the like, and/or a silica-based inorganic material.

The second electrode 150 may include a transparent conductive material such as indium tin oxide (ITO), indium zinc oxide (IZO), zinc oxide (ZnO), indium oxide ($In_2O_3$), and the like, or a reflective material such as lithium (Li), calcium (Ca), lithium fluoride/calcium (LiF/Ca), lithium fluoride/aluminum (LiF/Al), aluminum (Al), silver (Ag), magnesium (Mg), gold (Au), and/or the like.

The first electrode 130, the organic emission layer 140, and the second electrode 150 form an organic light emitting diode OLED.

In some embodiments, the first electrode 130 is an anode, which is a hole injection electrode, and the second electrode 150 is a cathode, which is an electron injection electrode. However, the exemplary embodiment is not limited thereto, and the first electrode 130 may be a cathode and the second electrode 150 may be an anode. Holes and electrons are injected into the organic emission layer 140 from the first electrode 130 and the second electrode 150, respectively, and excitons generated by coupling injected holes and electrons fall from an excited state to a ground state to emit light.

As shown in FIG. 2 and FIG. 3, the plurality of pixels PX include a center pixel PX1 that is disposed in (e.g., at) the center portion 2a of the display panel 2 and an outer pixel PX2 that is disposed at an outer portion 2b of the display panel 2.

The outer pixel PX2 includes upper and lower pixels PXU and PXD that are respectively disposed in (e.g., at) upper and lower sides of the center pixel PX1 in a plane view, left and right pixels PXL and PXR that are respectively disposed in (e.g., at) the left and right sides of the center pixel PX1 in a plane view, and a diagonal pixel PXO that is disposed in (e.g., located along) a diagonal direction of the center pixel PX1 in a plane view.

In the display panel 2, a first area A1 where the light blocking layer 400 and the pixels PX are overlapped with each other in a plane view is formed close to the outer portion 2b. For example, the center pixel PX1 does not have the first area A1 but the outer pixel PX2 has the first area A1.

In this case, the first area A1 where the light blocking layer 400 and the upper pixel PXU are overlapped with each other in a plane view is disposed in (e.g., at) an upper portion of the upper pixel PXU in a plane view, and the first area A1 where the light blocking layer 400 and the lower pixel PXD are overlapped with each other is disposed in (e.g., at) a lower portion of the lower pixel PXD in a plane view. The first area A1 where the light blocking layer 400 and the left pixel PXL are overlapped with each other in a plane view is disposed in (e.g., at) a left portion of the left pixel PXL in a plane view, and the first area A1 where the light blocking layer 400 and the right pixel PXR are overlapped with each other in a plane view is disposed in (e.g., at) a right portion of the right pixel PXR in a plane view. The first area A1 where the light blocking layer 400 and the diagonal pixel PXO overlap is disposed in (e.g., located along) a diagonal direction of the diagonal pixel PXO in a plane view.

The area of the first area A1 where the light blocking layer 400 and the pixel PX are overlapped with each other in a plane view may be gradually increased toward the outer portion 2b from the center portion 2a of the display panel 2. In addition, the area of a second area A2 where the light blocking opening 410 and the pixel PX are overlapped with each other in a plane view is gradually decreased toward the outer portion 2b of the display panel 2 from the center portion 2a.

The light blocking layer 400 partially blocks reflection of light transmitted through the light blocking opening 410 to the outside, and therefore the light blocking layer 400 can minimize or reduce reflectance of external light. Accordingly, generation of a ghost image due to reflection of external light can be prevented or reduced. Further, since an aperture ratio is decreased as the resolution is increased, the reflectance of the external light can be more significantly or substantially reduced by the light blocking layer 400.

As can be seen in FIG. 4, an overcoat 500 that covers the light blocking layer 400 is disposed on the light blocking layer 400, and a window 600 may be disposed on the overcoat 500. The window 600 may include glass and the like for protection of the display panel 2 from an external environment.

The distanced between the center C1 of the pixel PX and the center C2 of the light blocking opening 410 may be gradually increased toward the outer portion 2b from the center portion 2a of the display panel 2.

In embodiments of the head mounted display device, the eyes eb of the user U and the display panel are disposed at a short distance, a length P1 of the first display panel 21 is greater than the diameter R1 of the first optical system 31, and a length P2 of the second display panel 22 is greater than the diameter R2 of the second optical system 32, and therefore, unlike the light blocking layer 400 that is disposed in (e.g., at) the center portion 2a of the display panel 2, the light blocking layer 400 that is disposed in (e.g., at) the outer portion 2b of the display panel 2 has a set (e.g., predetermined) inclination with respect to the eyes eb of the user U. Accordingly, light emitted from the pixel openings 161 may be partially interfered with when being transmitted to the eyes eb of the user U through the optical system 3. However, in the present exemplary embodiment, the first area A1 where the light blocking layer 400 and the pixel PX are overlapped with each other in a plane view is gradually increased toward the outer portion 2b from the center portion 2a of the display panel 2, and therefore light emitted from the pixel opening 161 is not blocked (or not substantially blocked) by the light blocking layer 400 that is disposed in (e.g., at) the outer portion 2b of the display panel 2.

Figure 5:
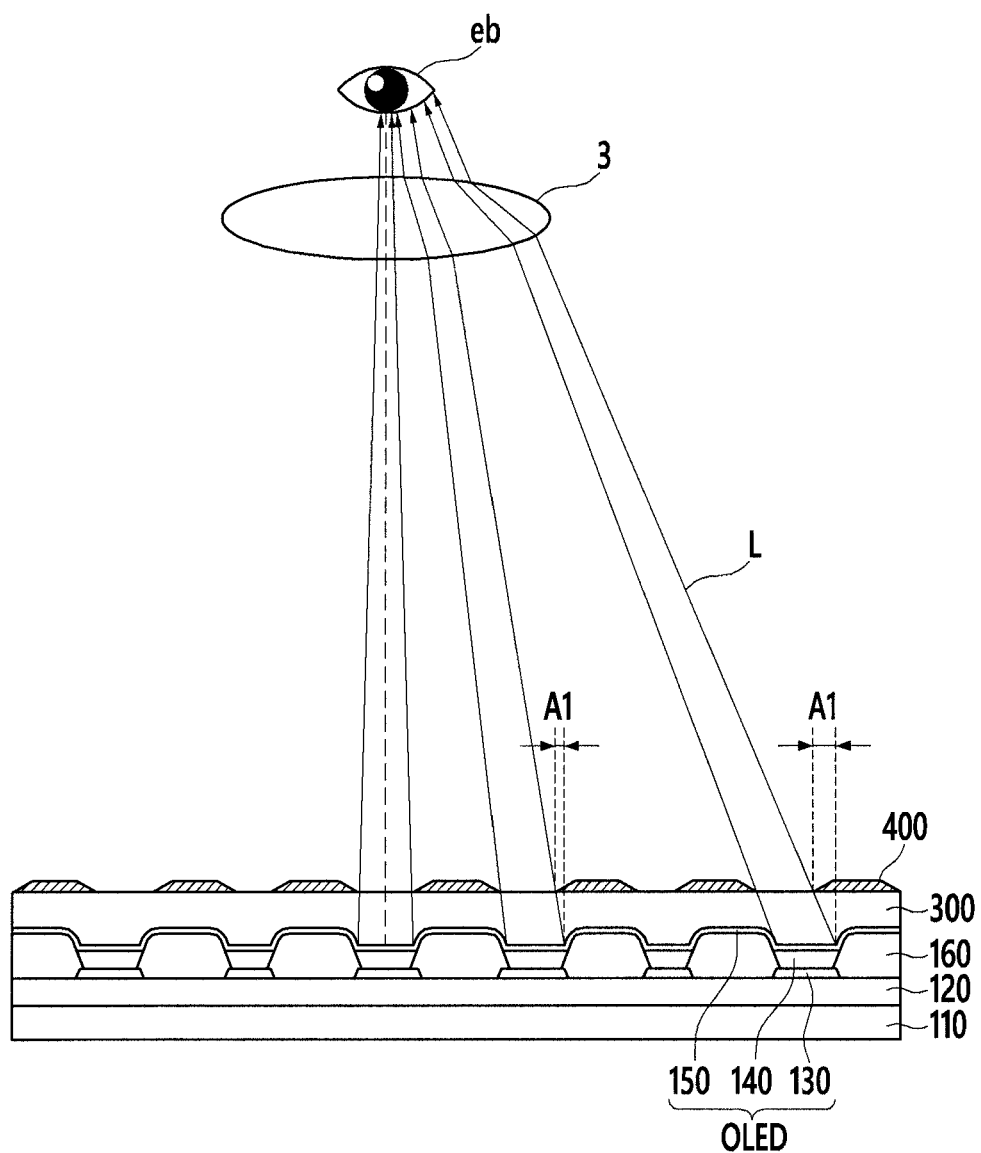
FIG. 5 is a schematic view of a relationship between an eye of a user who uses the head mounted display device of FIG. 1, an optical system, and the display panel.

FIG. 5 schematically illustrates a relationship between the eyes of the user who uses the head mounted display device of FIG. 1, the optical system, and the display panel.

As shown in FIG. 5, the first area A1 where the light blocking layer 400 and the pixel PX are overlapped with each other in a plane view is gradually increased toward the outer portion 2b of the display panel 2 from the center portion 2a of the display panel 2. Thus, like the light blocking layer 400 that is disposed in (e.g., at) the center portion 2a of the display panel 2, the light blocking layer 200 that is disposed in (e.g., at) the outer portion 2b of the display panel 2 does not interfere (or does not substantially interfere) with transmission of the light L transmitted from the pixel opening 161 to the eyes eb of the user U through the optical system 3. Accordingly, transmittance can be improved.

In addition, no additional circularly polarized light film is used for anti-reflection of external light, and accordingly transmittance can be improved.

Meanwhile, in the present exemplary embodiment, a vertical curvature and a horizontal curvature of the convex lens that form the optical system 3 are equal to each other, but when the two curvatures are different from each other, the first areas A1 of the outer pixel PX2 may be different from each other depending on their respective locations.

Meanwhile, in the exemplary embodiment shown in FIG. 1 to FIG. 5, only the light blocking layer serves to prevent or reduce reflection of the external light, but an anti-reflection layer may be additionally provided in another exemplary embodiment.

Hereinafter, a head mounted display device that further includes an anti-reflection layer according to another exemplary embodiment will be described with reference to FIG. 6 and FIG. 7.

Figure 6:
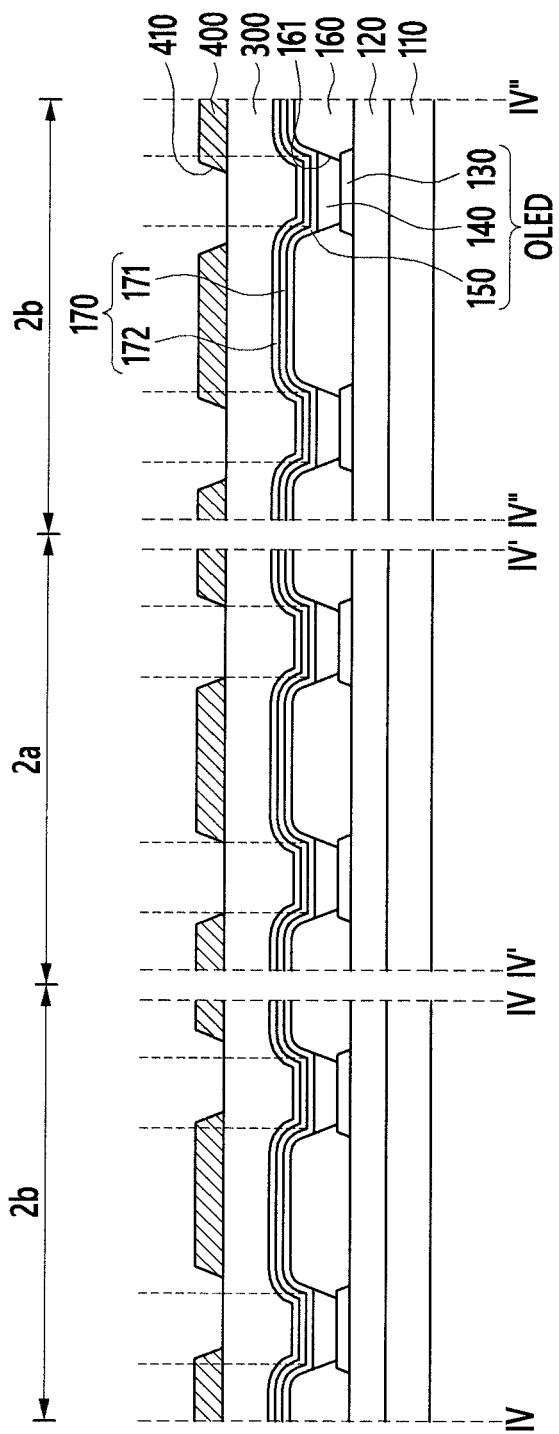
FIG. 6 is a schematic cross-sectional view of a display panel of a head mounted display device according to another exemplary embodiment, taken along positions that respectively correspond to the lines IV-IV, IV'-IV', and IV"-IV" of FIG. 2.

FIG. 6 is a schematic cross-sectional view of a head mounted display device according to another exemplary embodiment, and lines IV-IV, IV'-IV', and IV"-IV" are respectively taken along lines corresponding to lines IV-IV, IV'-IV', and IV"-IV" of FIG. 2. FIG. 7 is provided to illustrate an effect of an anti-reflection layer of FIG. 6.

Figure 7:
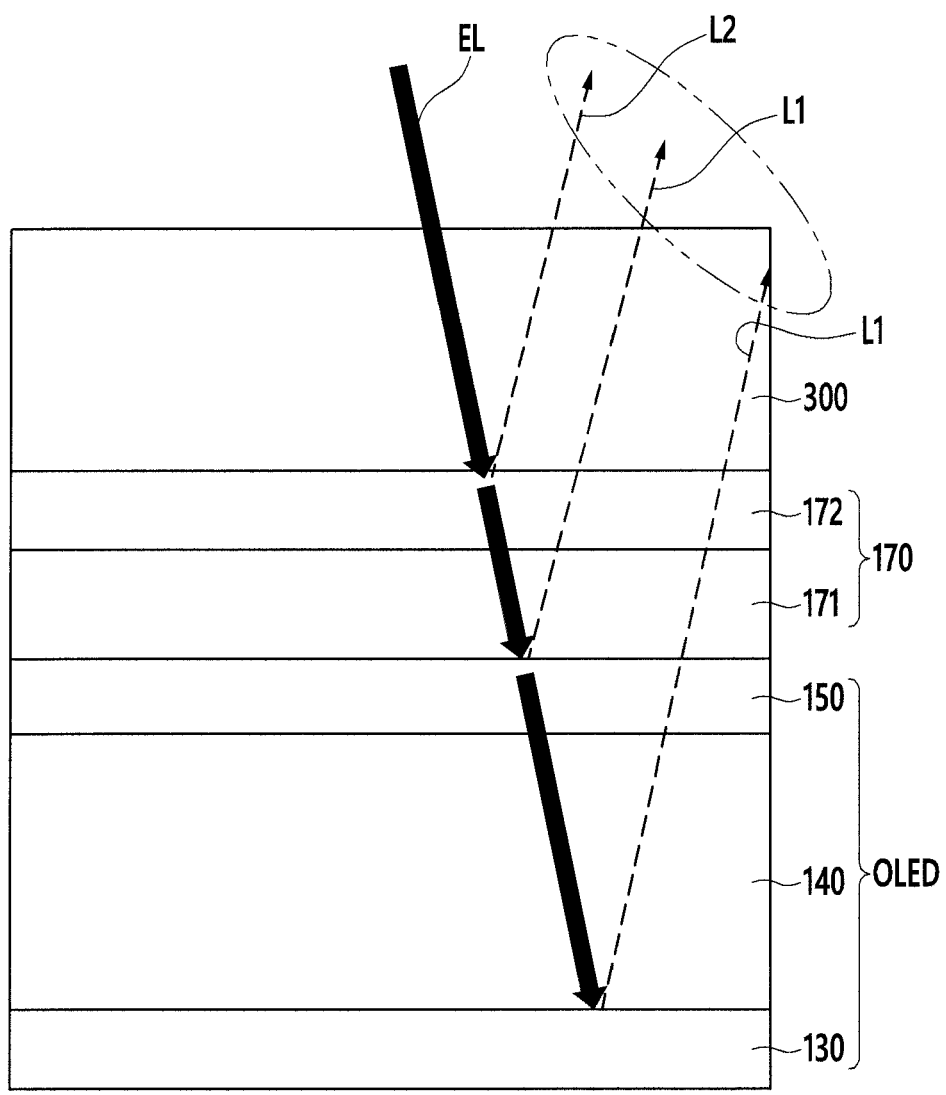
FIG. 7 is a cross-sectional view illustrating an effect of an anti-reflection layer of FIG. 6.

The exemplary embodiment shown in FIG. 6 and FIG. 7 is substantially the same as the exemplary embodiment shown in FIG. 1 to FIG. 5 except for the anti-reflection layer, and therefore, a duplicated description of the features of the embodiment shown in FIG. 1 to FIG. 5 is not necessary here.

As shown in FIG. 6, a head mounted display device according to the present exemplary embodiment includes an anti-reflection layer 170 that is disposed on a second electrode 150 for preventing reducing reflection of external light. The anti-reflection layer 170 includes a phase control layer 171 that is disposed on the second electrode 150 and an external light reflection layer 172 that is disposed on the phase control layer 171.

The phase control layer 171 may be an inorganic or organic insulation layer, and the external light reflection layer 172 may be a metal layer that has a set (e.g., predetermined) reflectance.

As shown in FIG. 7, a part of external light EL is reflected as first reflection light L1 in the first electrode 130 or the second electrode 150. Another part of the external light EL is reflected as second reflection light L2 in the external light reflection layer 172. In this case, the phase control layer 171 is controlled in thickness (e.g., the phase control layer 171 may have a set or predetermined thickness) for destructive interference between the first reflection light L1 and the second reflection light L2. Accordingly, the first reflection light L1 from the external light is eliminated or reduced, thereby minimizing or reducing reflection of external light.

Meanwhile, the anti-reflection layer shown in FIG. 6 and FIG. 7 includes the phase control layer 171 and the external light reflection layer 172, but an anti-reflection layer that has a different structure may be applicable to minimize or reduce reflection of external light by using destructive interference.

Figure 8:
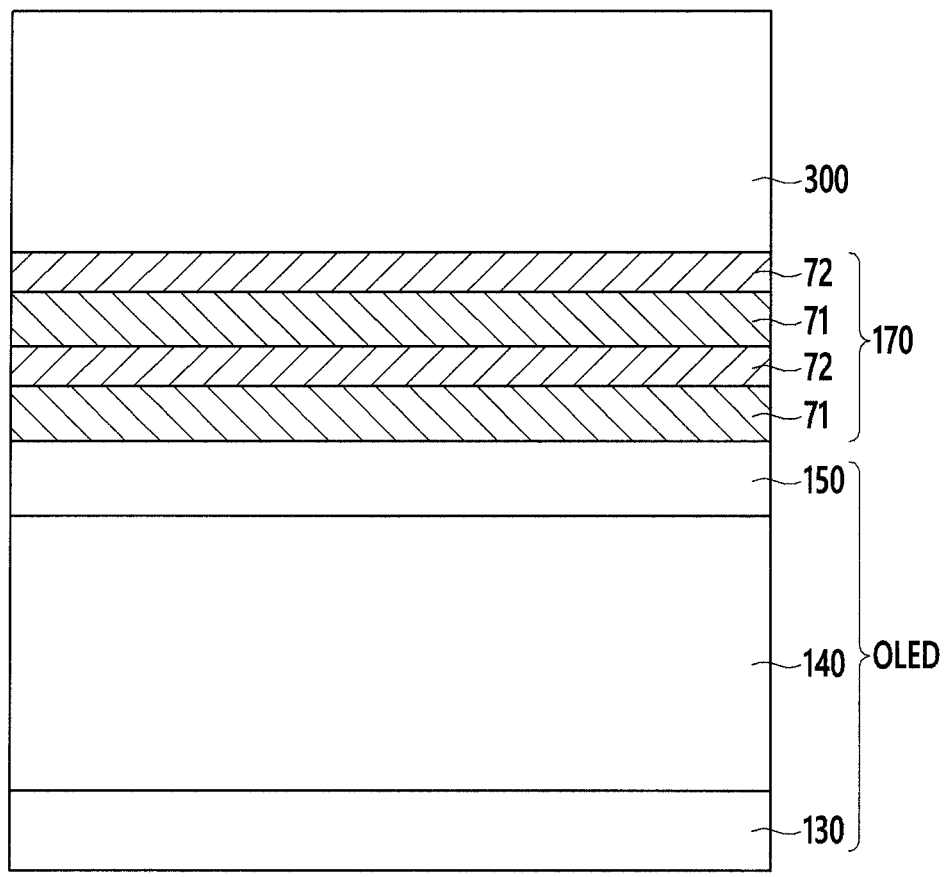
FIG. 8 and FIG. 9 are cross-sectional views showing anti-reflection layers according to some exemplary embodiments.
Figure 9:
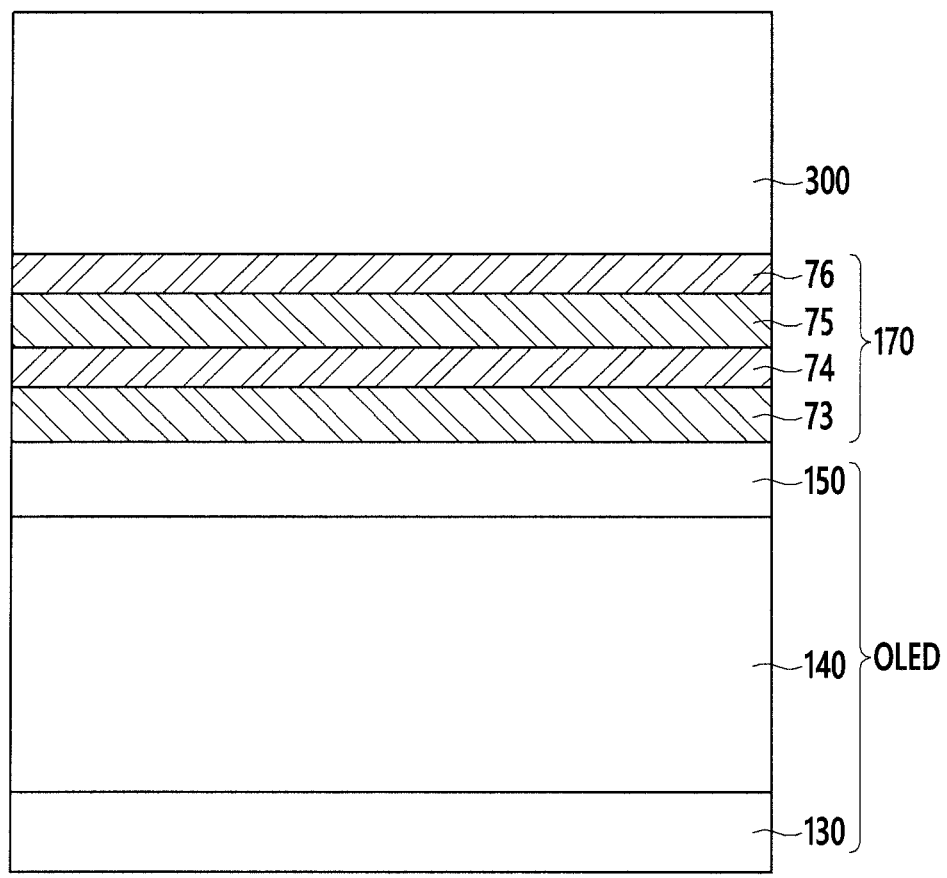

FIG. 8 and FIG. 9 show anti-reflection layers according to different exemplary embodiments. The exemplary embodiments shown in FIG. 8 and FIG. 9 are substantially the same as the exemplary embodiment shown in FIG. 6 and FIG. 7, except for a detailed structure of an anti-reflection layer, and therefore, a duplicated description of the features of the embodiment shown in FIG. 6 and FIG. 7 is not necessary here.

As shown in FIG. 8, an anti-reflection layer 170 includes inorganic layers 71 and organic layers 72 that are alternately stacked. For example, the organic layer 72 is disposed on the inorganic layer 71, and then the inorganic layer 71 is disposed on the organic layer 72, alternately. As the inorganic layers 71 and the organic layers 72 are alternately stacked, external light is eliminated or reduced by being destructively interfered with. Accordingly, reflection of external light can be minimized or reduced. In the present exemplary embodiment, two inorganic layers 71 and two organic layers 72 are illustrated, but this is not restrictive. The number of inorganic and organic layers can be variously modified unless destructive interference is not generated.

In addition, as shown in FIG. 9, an anti-reflection layer 170 includes a plurality of stacked layers 73, 74, 75, and 76. The plurality of layers 73, 74, 75, and 76 respectively have different refractive indexes. As described, the plurality of layers, each having different refractive indexes, are stacked such that external light is eliminated or reduced by being destructively interfered with. Accordingly, reflection of external light can be minimized or reduced. In the present exemplary embodiment, four layers that have different refractive indexes are illustrated, but this is not restrictive, and the number of layers to be stacked may be variously modified unless destructive interference is not generated. In the exemplary embodiment of FIG. 1 to FIG. 5, the window is disposed on the light blocking layer, but a transmittance control layer may be disposed on the light blocking layer in another exemplary embodiment.

Hereinafter, a head mounted display device that additionally includes a transmittance control layer according to another exemplary embodiment will be described in detail with reference to FIG. 10.

Figure 10:
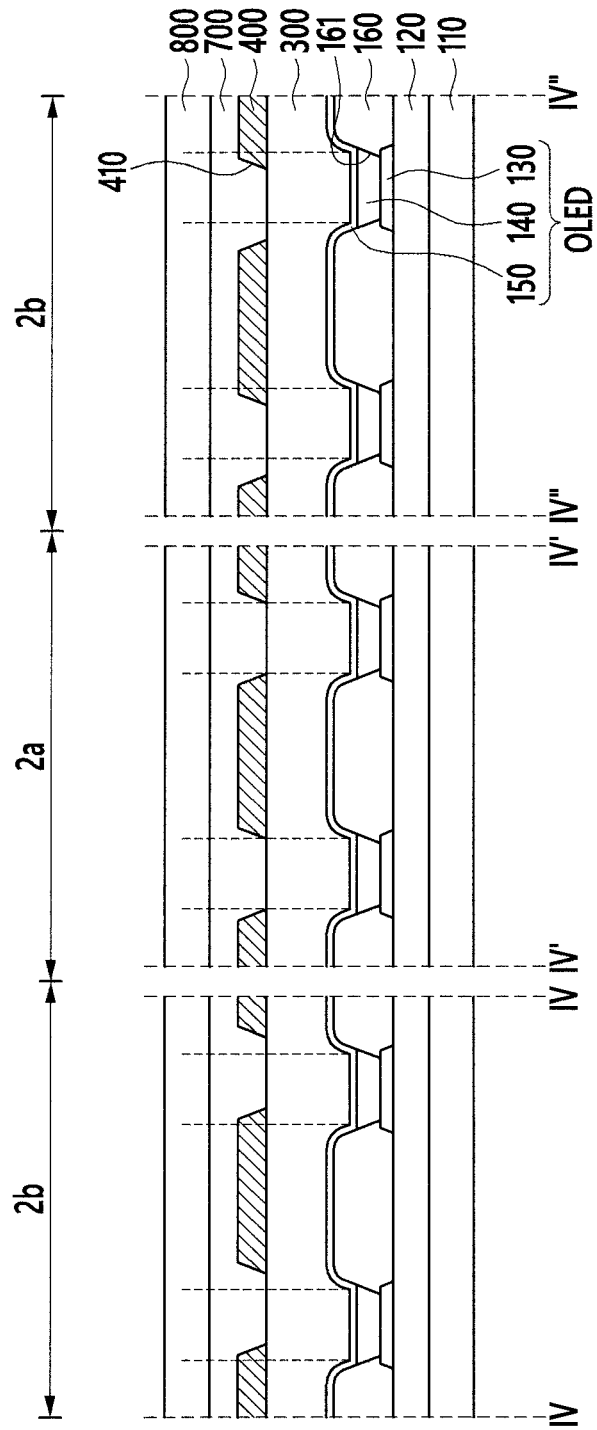
FIG. 10 is a schematic cross-sectional view of a head mounted display device according to another exemplary embodiment, and lines IV-IV, IV'-IV', and IV"-IV" are respectively taken along lines corresponding to lines IV-IV, IV'-IV', and IV"-IV" of FIG. 2.

FIG. 10 is a schematic cross-sectional view of a head mounted display device according to another exemplary embodiment, and lines IV-IV, IV'-IV', and IV"-IV" are respectively taken along lines corresponding to lines IV-IV, IV'-IV', and IV"-IV" of FIG. 2.

The exemplary embodiment shown in FIG. 10 is substantially the same as the exemplary embodiment shown in FIG. 1 to FIG. 5, except for a transmittance control layer, and therefore, a duplicated description of the features of the embodiment shown in FIG. 1 to FIG. 5 is not necessary here.

As shown in FIG. 10, in the head mounted display device according to the present exemplary embodiment, an adhesion layer 700 that covers a light blocking layer 400 is disposed on the light blocking layer 400. In addition, a transmittance control layer 800 is disposed on the adhesion layer 700. The adhesion layer 700 serves to bond the transmittance control layer 800 onto the light blocking layer

400. The transmittance control layer 800 controls transmittance to minimize or reduce reflection of external light.

The window is disposed on the light blocking layer in the exemplary embodiment of FIG. 1 to FIG. 5, but a circularly polarized layer may be disposed on a light blocking layer in another exemplary embodiment.

Hereinafter, referring to FIG. 11, a head mounted display device that additionally includes a circularly polarized layer according to another exemplary embodiment will be described in detail.

Figure 11:
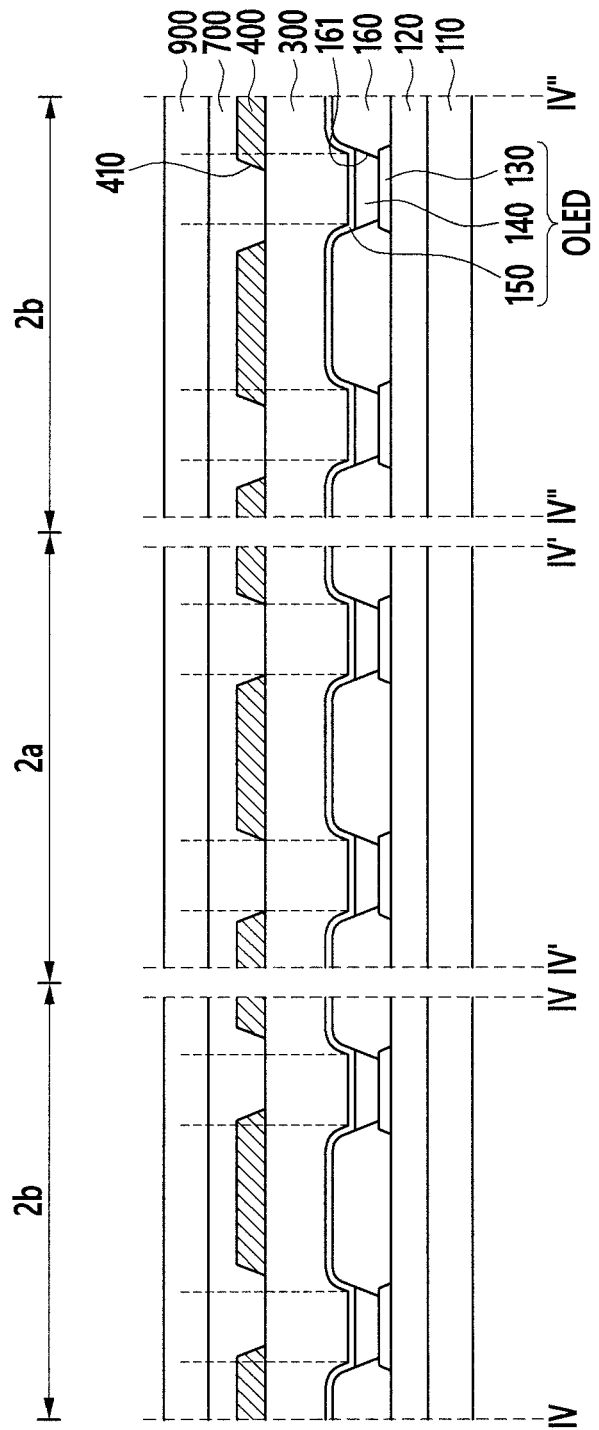
FIG. 11 is a schematic cross-sectional view of a head mounted display device according to another exemplary embodiment, and lines IV-IV, IV'-IV', and IV"-IV" are respectively taken along lines corresponding to lines IV-IV, IV'-IV', and IV"-IV" of FIG. 2.

FIG. 11 is a schematic cross-sectional view of a head mounted display device according to another exemplary embodiment, and lines IV-IV, IV'-IV', and IV"-IV" are respectively taken along lines corresponding to lines IV-IV, IV'-IV', and IV"-IV" of FIG. 2.

The exemplary embodiment shown in FIG. 11 is substantially the same as the exemplary embodiment shown in FIG. 1 to FIG. 5, except for a circularly polarized layer, and therefore, a duplicated description of the features of the embodiment shown in FIG. 1 to FIG. 5 is not necessary here.

As shown in FIG. 11, in a head mounted display device according to the present exemplary embodiment, an adhesion layer 700 that covers a light blocking layer 400 is disposed on the light blocking layer 400. In addition, a circularly polarized layer 900 is disposed on the adhesion layer 700. The adhesion layer 700 serves to bond the circularly polarized layer 900 onto the light blocking layer 400. The circularly polarized layer 900 linearly polarizes external light and concurrently (e.g., at the same time) delays a phase to thereby minimize or reduce reflection of external light. For example, the circularly polarized layer 900 may include a linearly polarized layer that linearly polarizes external light and a phase delay layer that delays a phase of the linearly polarized light.

In the exemplary embodiment of FIG. 1 to FIG. 5, transmittance is improved by adjusting an alignment between the light blocking layer that is disposed between the center portion of the display panel and the outer portion and the pixels, but transmittance can be improved by adjusting a thickness of a light blocking layer that is disposed in (e.g., at) a center portion and an outer portion of a display panel according to another exemplary embodiment.

Hereinafter, a head mounted display device of which a thickness of a light blocking layer is adjusted according to another exemplary embodiment will be described in detail with reference to FIG. 12.

Figure 12:
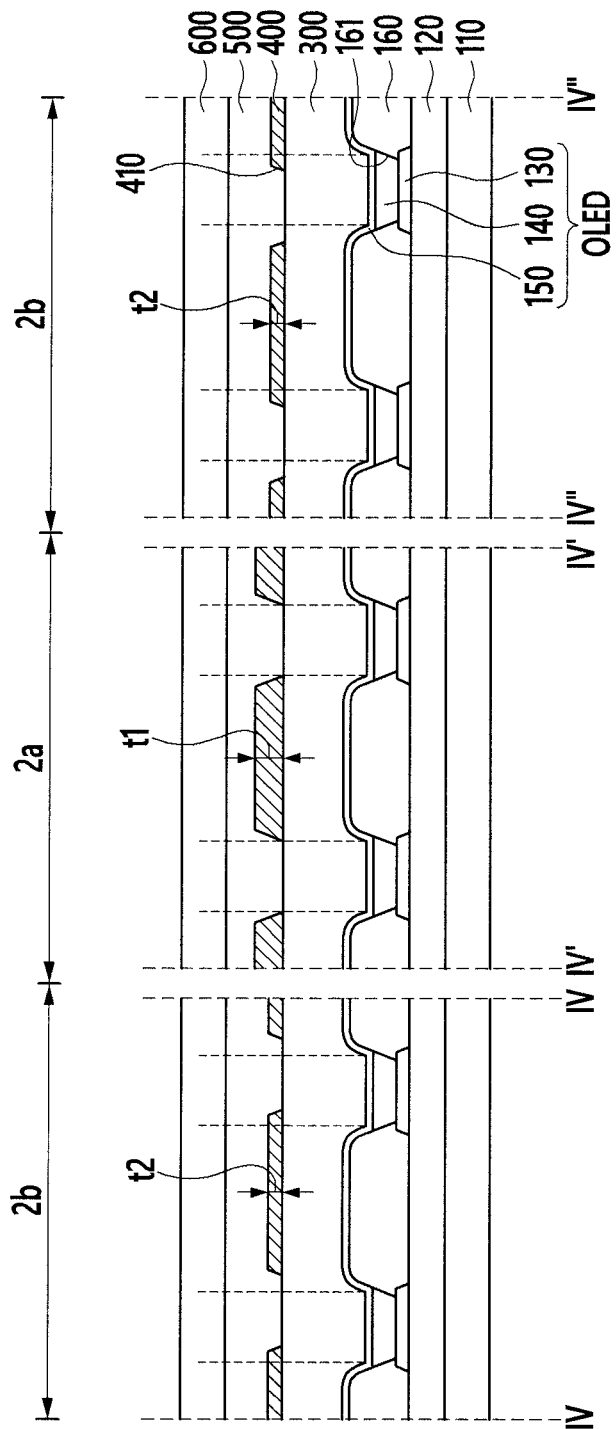
FIG. 12 is a schematic cross-sectional view of a head mounted display device according to another exemplary embodiment, and lines IV-IV, IV'-IV', and IV"-IV" are respectively taken along lines corresponding to lines IV-IV, IV'-IV', and IV"-IV" of FIG. 2.

FIG. 12 is a schematic cross-sectional view of a head mounted display device according to another exemplary embodiment, and lines IV-IV, IV'-IV', and IV"-IV" are respectively taken along lines corresponding to lines IV-IV, IV'-IV', and IV"-IV" of FIG. 2.

The exemplary embodiment shown in FIG. 12 is substantially the same as the exemplary embodiment shown in FIG. 1 to FIG. 5, except for a transmittance control layer, and therefore, a duplicated description of the features of the embodiment shown in FIG. 1 to FIG. 5 is not necessary here.

As shown in FIG. 12, a thickness of a light blocking layer 400 of the head mounted display device according to the present exemplary embodiment is gradually decreased toward an outer portion 2b of a display panel 2 from a center portion 2a thereof. For example, a second thickness t2 of the light blocking layer 400 that is disposed in (e.g., at) the outer portion 2b of the display panel 2 is smaller than a first thickness t1 of the light blocking layer 400 that is disposed in (e.g., at) the center portion 2a of the display panel 2. In addition, the second thickness t2 of the light blocking layer 400 is more decreased toward the outer portion 2b. Thus, like the light blocking layer 400 that is disposed in (e.g., at) the center portion 2a of the display panel 2, the light blocking layer 400 that is disposed in (e.g., at) the outer portion 2b of the display panel 2 does not interfere (or does not substantially interfere) with transmission of light L emitted from a pixel opening 161 to eyes eb of a user U through an optical system 3. Accordingly, transmittance can be improved.

A thickness (e.g., a minimum thickness) of the light blocking layer 400 should provide or assure a desired or suitable optical density. The optical density implies light blocking performance, and light can be effectively blocked only when an appropriate or suitable light amount and a thickness that is consistent depending on materials are assured (or utilized).

Meanwhile, in the exemplary embodiment of FIG. 1 to FIG. 5, transmittance is improved by adjusting an alignment between the light blocking layer that is disposed between the center portion of the display panel and the outer portion and the pixels, but transmittance can be improved by adjusting a thickness of a light blocking layer that is disposed in (e.g., at) a center portion and an outer portion of a display panel according to another exemplary embodiment.

Hereinafter, a head mounted display device in which a size of a light blocking opening is adjusted according to another exemplary embodiment will be described in detail with reference to FIG. 13 and FIG. 14.

Figure 13:
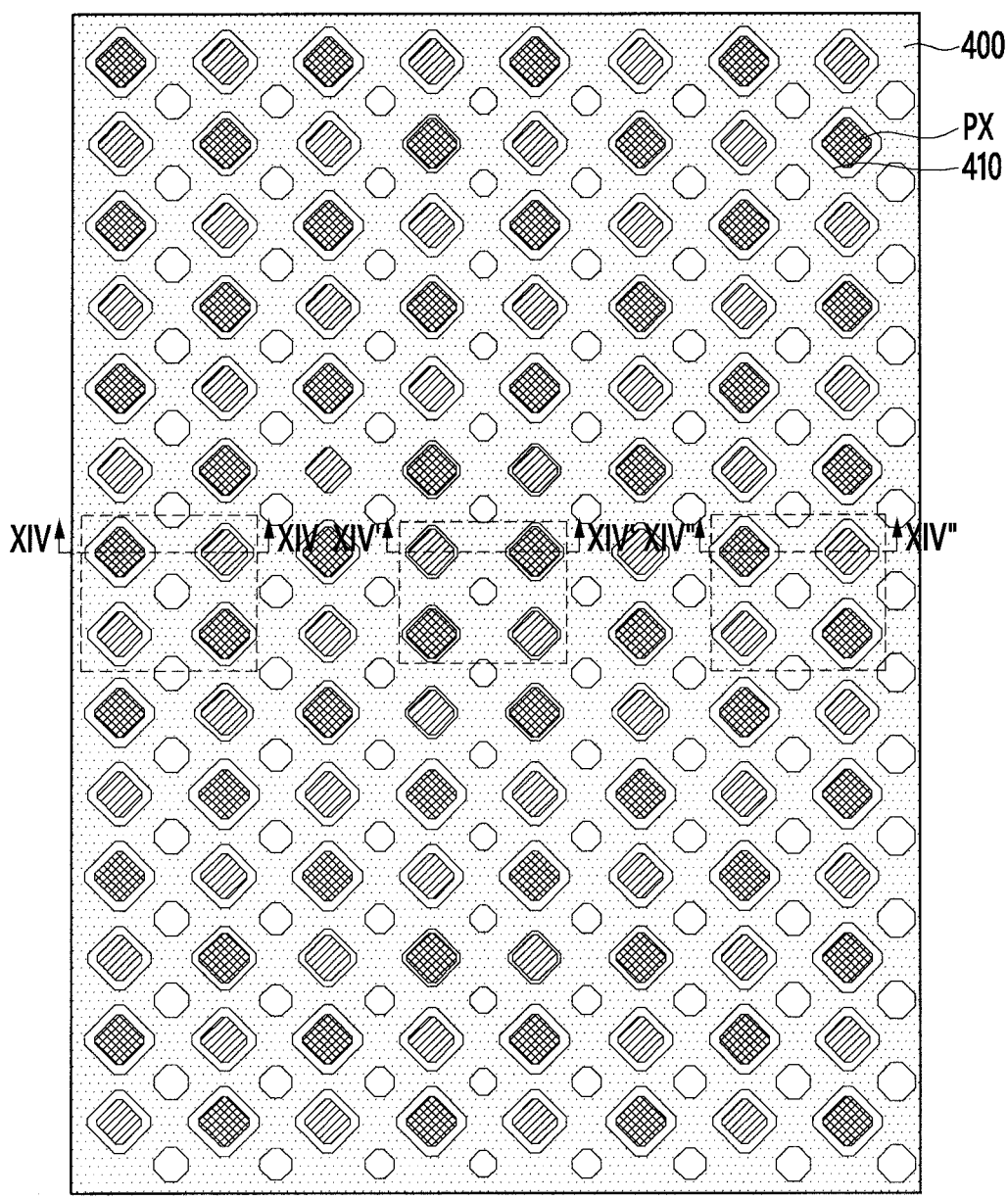
FIG. 13 is a schematic top plan view of a head mounted display device according to another exemplary embodiment.
Figure 14:
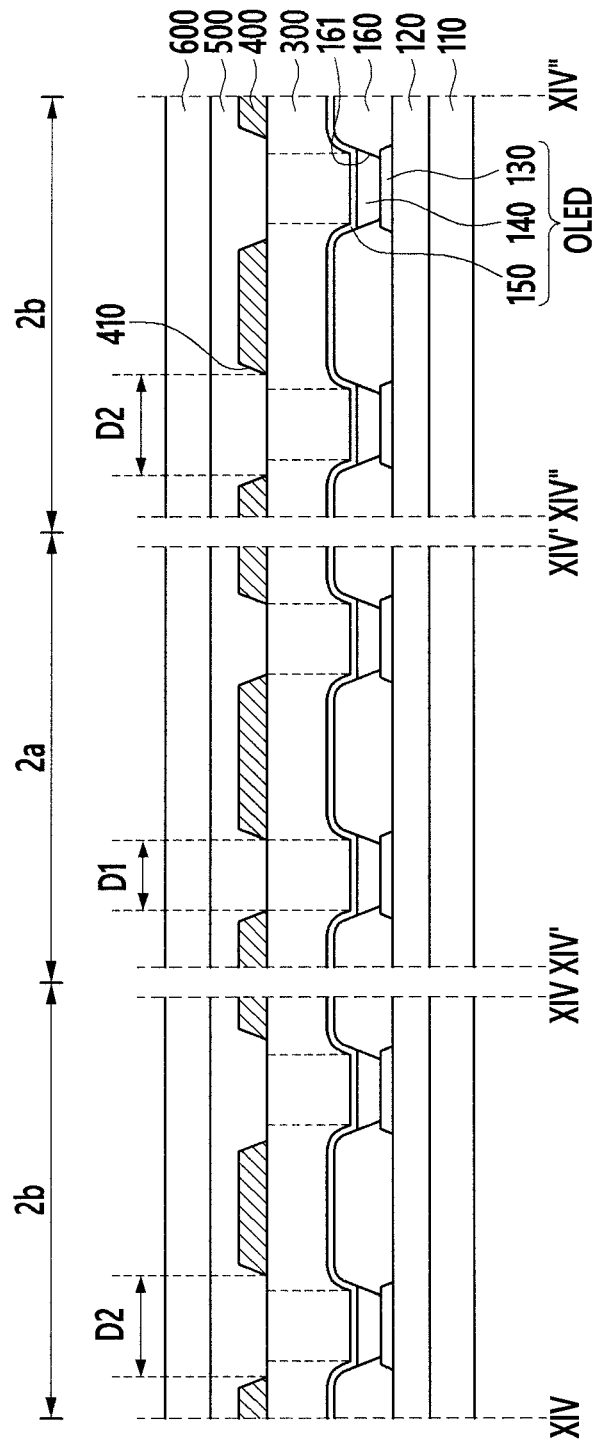
FIG. 14 is a cross-sectional view of FIG. 13, taken along respective lines XIV-XIV, XIV'-XIV', and XIV"-XIV".

FIG. 13 is a schematic top plan view of a head mounted display device according to another exemplary embodiment, and FIG. 14 is a cross-sectional view of FIG. 13, taken along the lines XIV-XIV, XIV'-XIV', and XIV"-XIV".

The exemplary embodiment shown in FIG. 13 and FIG. 14 is substantially the same as the exemplary embodiment of FIG. 1 to FIG. 5, except for a light blocking layer, and therefore, a duplicated description of the features of the embodiment shown in FIG. 1 to FIG. 5 is not necessary here.

As shown in FIG. 13 and FIG. 14, in a head mounted display device according to the present exemplary embodiment, a size of a light blocking opening 410 of a light blocking layer 400 is gradually increased toward an outer portion 2b of a display panel 2 from a center portion 2a of the display panel 2. For example, a second size D2 of the light blocking opening 410 that is disposed in (e.g., at) the outer portion 2b of the display panel 2 is smaller than a first size D1 of the light blocking opening 410 that is disposed in (e.g., at) the center portion 2a of the display panel 2. In addition, the second size D2 of the light blocking 410 is more decreased toward the outer portion 2b. Thus, like the light blocking layer 400 that is disposed in (e.g., at) the center portion 2a of the display panel 2, the light blocking layer 400 that is disposed in (e.g., at) the outer portion 2b of the display panel 2 does not interfere (or does not substantially interfere) with transmission of light L emitted from a pixel opening 161 to eyes eb of a user U through an optical system 3. Accordingly, transmittance can be improved.

In the exemplary embodiment of FIG. 13 and FIG. 14, the size of the light blocking opening in the center portion of the display panel and the size of the light blocking opening in the outer portion of the display panel are adjusted to improve transmittance, but alignment of the light blocking openings in the center portion and the outer portion of the display panel and pixels can be controlled together to thereby further improve transmittance.

Hereinafter, a head mounted display device in which a size of a light blocking opening is adjusted and concurrently (e.g., at the same time) alignment between the light blocking opening and pixels is controlled will be described in detail with reference to FIG. 15 and FIG. 16.

Figure 15:
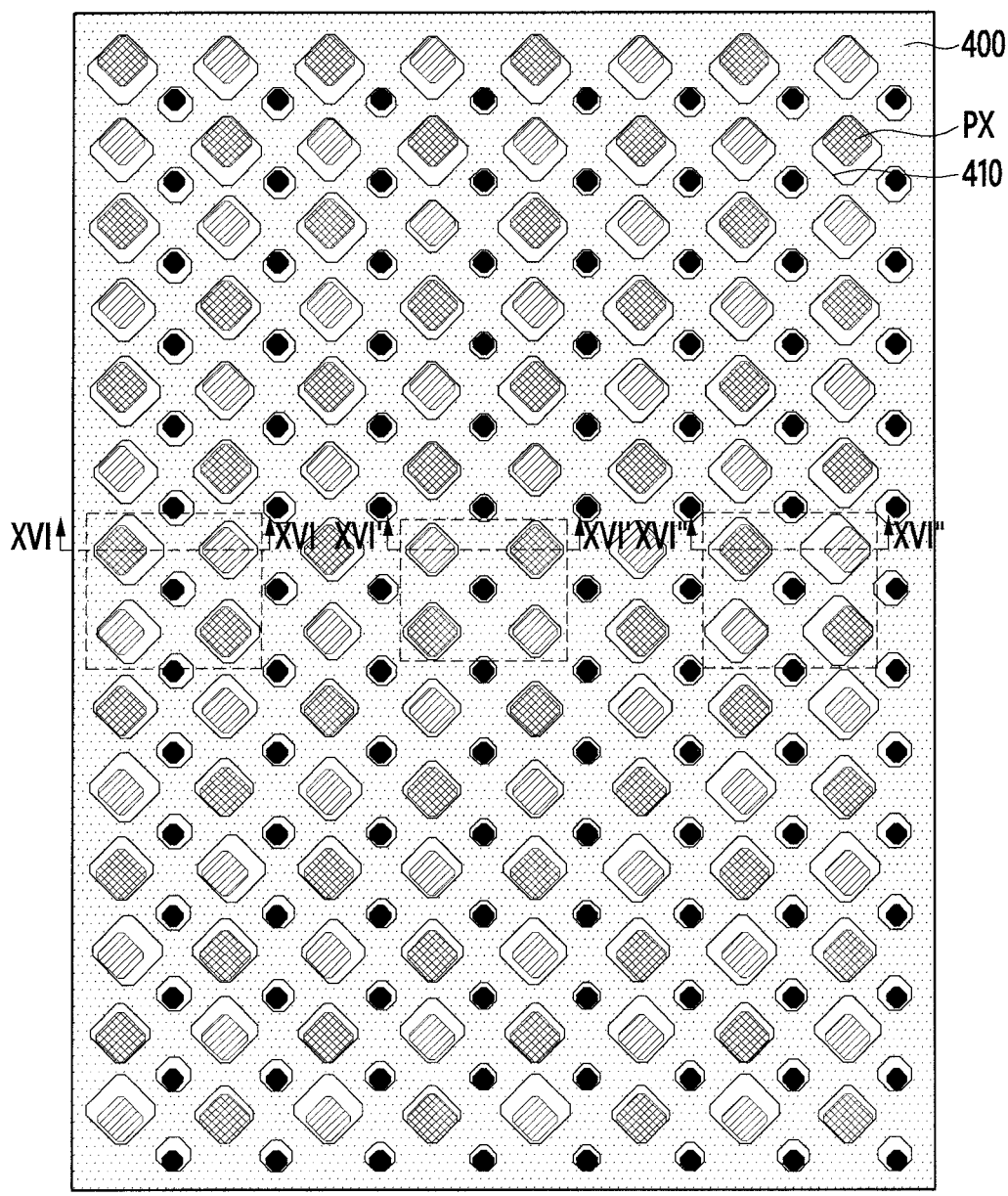
FIG. 15 is a schematic top plan view of a head mounted display device according to another exemplary embodiment.
Figure 16:
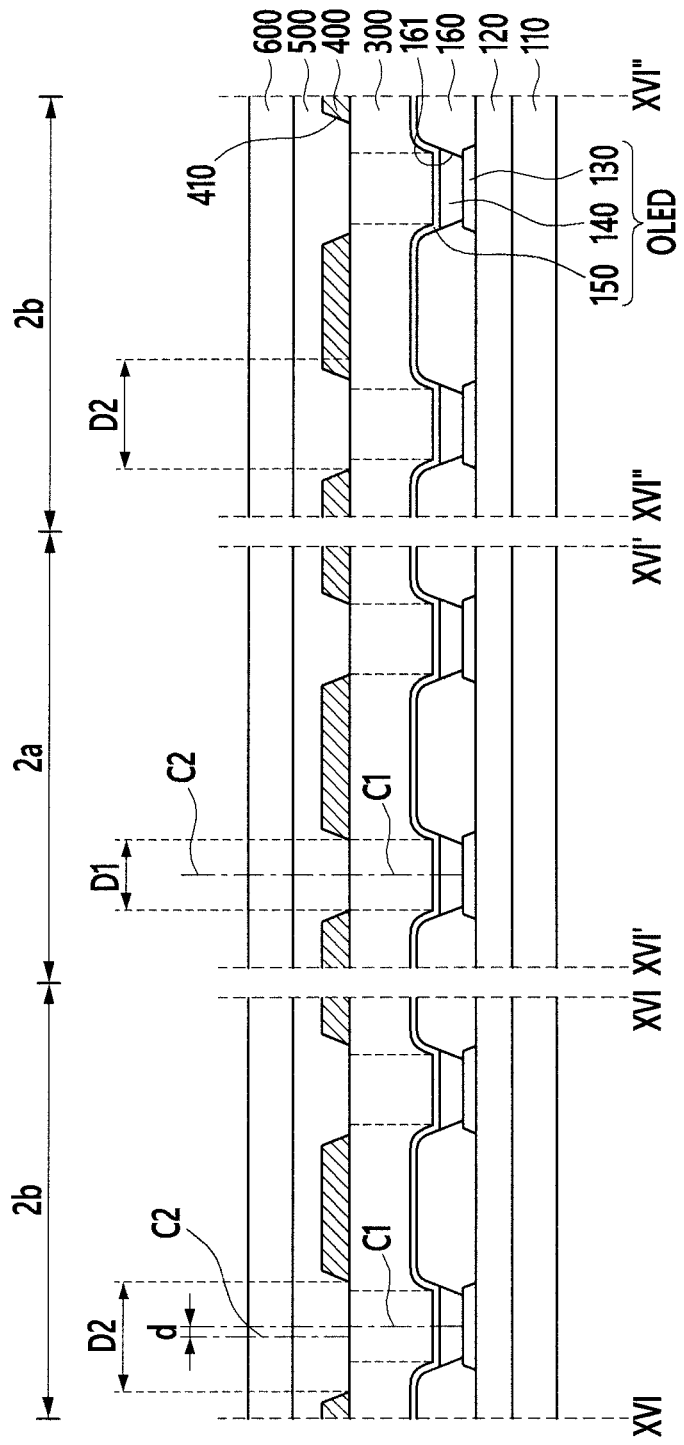
FIG. 16 is a cross-sectional view of FIG. 15, taken along the lines XVI-XVI, XVI'-XVI', and XVI"-XVI".

FIG. 15 is a schematic top plan view of a head mounted display device according to another exemplary embodiment, and FIG. 16 is a cross-sectional view of FIG. 15, taken along the lines XVI-XVI, XVI'-XVI', and XVI"-XVI".

The exemplary embodiment shown in FIG. 15 and FIG. 16 is substantially the same as the exemplary embodiment of FIG. 13 and FIG. 14, except for a light blocking layer, and therefore, a duplicated description of the features of the embodiment shown in FIG. 13 and FIG. 14 is not necessary here.

As shown in FIG. 15 and FIG. 16, in a head mounted display device according to the present exemplary embodiment, a size of a light blocking opening 410 of a light blocking layer 400 is gradually increased toward an outer portion 2b of a display panel 2 from a center portion 2a of the display panel 2. For example, a second size D2 of the light blocking opening 410 that is disposed in (e.g., at) the outer portion 2b of the display panel 2 is smaller than a first size D1 of the light blocking opening 410 that is disposed in (e.g., at) the center portion 2a of the display panel 2. In addition, the second size D2 of the light blocking 410 is more decreased toward the outer portion 2b.

Further, a distance dl between a center C1 of a pixel PX and a center C2 of the light blocking opening 410 may be gradually increased toward the outer portion 2b of the display panel 2 from the center portion 2a of the display panel 2. Thus, the light blocking layer 400 that is disposed in (e.g., at) the outer portion 2b of the display panel 2 does not interfere (or does not substantially interfere) with transmission of light L emitted from a pixel opening 161 to eyes eb of a user U through an optical system 3. Accordingly, transmittance can be more improved.

While this disclosure has been described in connection with what is presently considered to be practical example embodiments, it is to be understood that the disclosure is not limited to the disclosed embodiments, but, on the contrary, is intended to cover various modifications and equivalent arrangements included within the spirit and scope of the appended claims.

| Description of some of the symbols | | | |
|---|---|---|---|
| 1: | case | 2: | display panel |
| 2a: | center portion | 2b: | outer portion |
| 3: | optical system | 100: | pixel layer |
| 110: | substrate | 120: | switching layer |
| 130: | first electrode | 140: | organic emission layer |
| 150: | second electrode | 160: | pixel defined layer |
| 161: | pixel opening | 170: | anti-reflection layer |
| 300: | sealing layer | 400: | light blocking layer |
| 410: | light blocking opening | 500: | overcoat |
| 600: | window | 700: | adhesion layer |
| 800: | transmittance control layer | 900: | circularly polarized layer |

What is claimed is:

1. A head mounted display device comprising:
   a case;
   a display panel in the case and capable of displaying an image; and
   an optical system between the display panel and a user, wherein the display panel comprises:
   a pixel layer comprising a plurality of pixels capable of emitting light, and
   a light blocking layer on the pixel layer and having a plurality of light blocking layer openings,
   wherein an area of a first area where a portion of the light blocking layer and a respective one of the pixels are overlapped with each other in a plane view is gradually increased toward an outer portion of the display panel from a center portion of the display panel.

2. The head mounted display device of claim 1, wherein an area of a second area where a respective one of the light blocking layer openings and the respective one of the pixels are overlapped with each other in a plane view is gradually decreased toward the outer portion of the display panel from the center portion of the display panel.

3. The head mounted display device of claim 1, wherein a distance between a center of the respective one of the pixels and a center of the respective one of the light blocking layer openings is gradually increased toward the outer portion of the display panel from the center portion of the display panel.

4. The head mounted display device of claim 1, wherein the center portion of the display panel is located corresponding to a center of eyes of a user and a center of the optical system.

5. The head mounted display device of claim 1, wherein:
   the plurality of pixels comprises center pixels at the center portion of the display panel and outer pixels at the outer portion of the display panel,
   the outer pixels comprise upper and lower pixels respectively at upper and lower sides of the center pixel, left and right pixels respectively at left and right sides of the center pixel, and a diagonal pixel that is located along a diagonal direction from the center pixel, and
   the first area in the upper pixel is at an upper portion of the upper pixel in a plane view and the first area in the lower pixel is at a lower portion of the lower pixel in a plane view.

6. The head mounted display device of claim 5, wherein the first area of the left pixel is at a left portion of the left pixel in a plane view, the first area of the right pixel is at a right portion of the right pixel in a plane view, and the first area of the diagonal pixel is located along a diagonal direction from the diagonal pixel in a plane view.

7. The head mounted display device of claim 1, wherein the pixel layer comprises:
   a substrate;
   a switching layer on the substrate and comprising a switching element;
   a first electrode on the switching layer and connected with the switching element;
   a pixel defined layer comprising a pixel opening on the first electrode and overlapping the first electrode;
   a second electrode facing the first electrode; and
   an organic emission layer between the first electrode and the second electrode,
   wherein the pixels define an area to which light emitted from the first electrode, the second electrode, and the organic emission layer is emitted through the pixel openings, and
   a size of each pixel corresponds to a size of each pixel opening.

8. The head mounted display device of claim 7, wherein the pixel layer further comprises an anti-reflection layer that reflects external light.

9. The head mounted display device of claim 8, wherein the anti-reflection layer comprises:
   an external light reflection layer on the second electrode, and
   a phase control layer between the second electrode and the external light reflection layer, wherein the phase control layer provides destructive interference between first reflection light reflected from the second electrode or the first electrode and second reflection light reflected from the external light reflection layer.

10. The head mounted display device of claim 8, wherein the anti-reflection layer comprises a plurality of layers that are stacked and respectively have different refractive indexes.

11. The head mounted display device of claim 8, wherein the anti-reflection layer comprises inorganic layers and organic layers that are alternately stacked.

12. The head mounted display device of claim 8, wherein the display panel further comprises a sealing layer between the anti-reflection layer and the light blocking layer and sealing the pixel layer.

13. The head mounted display device of claim 1, wherein the display panel further comprises a transmittance control layer on the light blocking layer.

14. The head mounted display device of claim 1, wherein the display panel further comprises a circularly polarized layer on the light blocking layer.

15. The head mounted display device of claim 1, wherein a thickness of the light blocking layer is gradually decreased toward the outer portion of the display panel from the center portion of the display panel.

16. The head mounted display device of claim 1, wherein the display panel comprises a first display panel that corresponds to a left eye of a user and a second display panel that corresponds to a right eye of the user,
the optical system comprises a first optical system that corresponds to the first display panel and a second optical system that corresponds to the second display panel, and
a length of the first display panel is greater than a diameter of the first optical system and a length of the second display panel is greater than a diameter of the second optical system.

17. The head mounted display device of claim 16, wherein a distance between the first optical system and the first display panel is greater than a distance from the left eye to the first optical system, and a distance between the second optical system and the second display panel is greater than a distance from the right eye to the second optical system.

18. A head mounted display device comprising:
a case;
a display panel that is disposed in the case and capable of displaying an image; and
an optical system between the display panel and a user,
wherein the display panel comprises:
a pixel layer comprising a plurality of pixels capable of emitting light and
a light blocking layer on the pixel layer and having a plurality of light blocking layer openings, and
a size of the light blocking layer openings is gradually increased toward an outer portion of the display panel from a center portion of the display panel.

19. The head mounted display device of claim 18, wherein a distance between a center of a respective one of the pixels and a center of a respective one of the light blocking layer openings is gradually increased toward the outer portion of the display panel from the center portion of the display panel.

20. The head mounted display device of claim 18, wherein the center portion of the display panel is disposed corresponding to a center of eyes of the user and a center of the optical system.

* * * * *